United States Patent
Lee et al.

(10) Patent No.: US 10,872,649 B2
(45) Date of Patent: Dec. 22, 2020

(54) MEMORY DEVICE CONFIGURED TO PERFORM ASYMMETRIC WRITE OPERATION ACCORDING TO WRITE DIRECTION

(71) Applicant: Samsung Electronics Co., Ltd., Suwon-si (KR)

(72) Inventors: Kyung Min Lee, Seoul (KR); Hyunsung Jung, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/507,536

(22) Filed: Jul. 10, 2019

(65) Prior Publication Data

US 2020/0090722 A1 Mar. 19, 2020

(30) Foreign Application Priority Data

Sep. 14, 2018 (KR) .................. 10-2018-0110186

(51) Int. Cl.
| | |
|---|---|
| *G11C 8/00* | (2006.01) |
| *G11C 11/16* | (2006.01) |
| *G11C 11/408* | (2006.01) |
| *G11C 11/4074* | (2006.01) |

(52) U.S. Cl.
CPC ...... *G11C 11/1657* (2013.01); *G11C 11/1673* (2013.01); *G11C 11/1675* (2013.01); *G11C 11/4074* (2013.01); *G11C 11/4085* (2013.01)

(58) Field of Classification Search
CPC ............ G11C 11/1657; G11C 11/1673; G11C 11/1675; G11C 11/4074; G11C 11/4085

USPC ............................................. 365/230.06, 148
See application file for complete search history.

(56) References Cited

U.S. PATENT DOCUMENTS

| | | | |
|---|---|---|---|
| 6,891,748 B2 | 5/2005 | Tsuchida et al. | |
| 7,154,798 B2 | 12/2006 | Lin et al. | |
| 7,173,846 B2 | 2/2007 | Lin et al. | |
| 7,606,055 B2 | 10/2009 | Liu | |
| 7,719,882 B2 | 5/2010 | Lin et al. | |
| 7,863,655 B2* | 1/2011 | Lung ................... | G11C 11/5678 257/246 |
| 8,233,309 B2* | 7/2012 | Fasoli ................ | G11C 13/0004 365/148 |

(Continued)

*Primary Examiner* — Viet Q Nguyen
(74) *Attorney, Agent, or Firm* — Harness, Dickey & Pierce, P.L.C.

(57) ABSTRACT

Disclosed are memory devices including a variable resistance memory cell and a word line control circuit. A memory device including a variable resistance memory cell including a variable resistance element, a first cell transistor, and a second cell transistor, a first end of the variable resistance element connected to a bit line, a second end of the variable resistance element, a first end of the first cell transistor, and a first end of the second cell transistor connected to the common node, a second end of the first cell transistor and a second end of the second cell transistor connected to a source line, and a word line control circuit configured to separate a sub word line connected to a gate electrode of the second cell transistor from a word line connected to a gate electrode of the first cell transistor in a first write operation and to connect the word line and the sub word line to each other in a second write operation may be provided.

17 Claims, 13 Drawing Sheets

(56) References Cited

U.S. PATENT DOCUMENTS

| | | | | |
|---|---|---|---|---|
| 8,320,159 B2* | 11/2012 | Wei | ............... | G11C 11/5685 |
| | | | | 365/148 |
| 9,589,615 B2 | 3/2017 | Kulkarni et al. | | |
| 9,711,215 B2 | 7/2017 | Manipatruni et al. | | |
| 2010/0008134 A1* | 1/2010 | Chen | ............... | G11C 11/16 |
| | | | | 365/171 |
| 2010/0034009 A1* | 2/2010 | Lu | ............... | G11C 13/0069 |
| | | | | 365/148 |
| 2010/0085795 A1* | 4/2010 | Zhu | ............... | G11C 11/1659 |
| | | | | 365/148 |
| 2010/0118590 A1* | 5/2010 | Carter | ............... | G11C 11/1659 |
| | | | | 365/148 |
| 2011/0007550 A1* | 1/2011 | Siegert | ............... | G11C 8/08 |
| | | | | 365/148 |
| 2011/0249490 A1* | 10/2011 | Zhu | ............... | G11C 11/1675 |
| | | | | 365/171 |
| 2016/0125927 A1* | 5/2016 | Wei | ............... | G11C 11/1673 |
| | | | | 365/148 |
| 2017/0345496 A1* | 11/2017 | Liu | ............... | G11C 13/0097 |

* cited by examiner

MEMORY DEVICE CONFIGURED TO PERFORM ASYMMETRIC WRITE OPERATION ACCORDING TO WRITE DIRECTION

CROSS-REFERENCE TO RELATED APPLICATIONS

This application claims priority under 35 U.S.C. § 119 to Korean Patent Application No. 10-2018-0110186, filed on Sep. 14, 2018, in the Korean Intellectual Property Office, the disclosure of which is incorporated by reference herein in its entirety.

BACKGROUND

Example embodiments of the inventive concepts described herein relate to memory devices, and more particularly, relate to memory device configured to perform an asymmetric write operation according to a write direction.

A demand on a nonvolatile semiconductor memory device which may implement higher integration and larger capacity is increasing from day to day. A representative example of the nonvolatile semiconductor memory device is a flash memory which is used in portable electronic devices as a memory device. Other devices having random accessibility and improved performance characteristics are being developed as alternatives to, for example, a flash memory, A magnetic random access memory (MRAM) using a variable resistance element (e.g., a tunneling magneto-resistive (TMR) layer) is one example of such alternative devices.

A write operation for a variable resistance element includes a bit line write operation and a source line write operation, in which current directions are different from each other. The bidirectional write scheme may cause an overcurrent upon performing the bit line write operation on a variable resistance memory cell, and may cause a decrease in driving capability due to a resistance of the variable resistance element upon performing the source line write operation on the variable resistance memory cell, thereby creating some issues in terms of durability and/or reliability of the memory device.

SUMMARY

Some example embodiments of the inventive concepts may provide memory devices configured to perform an asymmetric write operation in terms of a write direction.

According to an example embodiments, a memory device may include a variable resistance memory cell including a variable resistance element, a first cell transistor, and a second cell transistor, a first end of the variable resistance element connected to a bit line, a second end of the variable resistance element, a first end of the first cell transistor, and a first end of the second cell transistor connected to the common node, a second end of the first cell transistor and a second end of the second cell transistor connected to a source line, and a word line control circuit configured to separate a sub word line connected to a gate electrode of the second cell transistor from a word line connected to a gate electrode of the first cell transistor in a first write operation and to connect the word line and the sub word line to each other in a second write operation may be provided.

According to an example embodiments, a memory device may include a variable resistance element having a first end connected to a bit line, and a word line control circuit configured to select at least one of a first path or a second path, a second end of the variable resistance element connected to a source line that is commonly on the first path and the second path.

According to an example embodiments, a method of writing a memory cell, which includes a variable resistance element having a first end connected to a bit line and a second end connected to a source line through at least one of a first path or a second path, may include determining whether a write operation for the memory cell is a bit line write operation or a source line write operation, selecting at least one of the first path or the second path based on a result of the determination, and performing the bit line write operation or the source line write operation through the selected at least one path

BRIEF DESCRIPTION OF THE FIGURES

The above and other objects and features of the inventive concepts will become apparent by describing in detail some example embodiments thereof with reference to the accompanying drawings.

DETAILED DESCRIPTION

Below, some example embodiments of the inventive concepts may be described in detail and clearly to such an extent that an ordinary one in the art easily implements the inventive concepts.

Components described in the detailed description with reference to terms "part", "unit", "module", "-er", "-or", etc. and function blocks illustrated in drawings may be implemented with software, hardware, or a combination thereof.

The software may be a machine code, firmware, an embedded code, and application software. The hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

Figure 1:
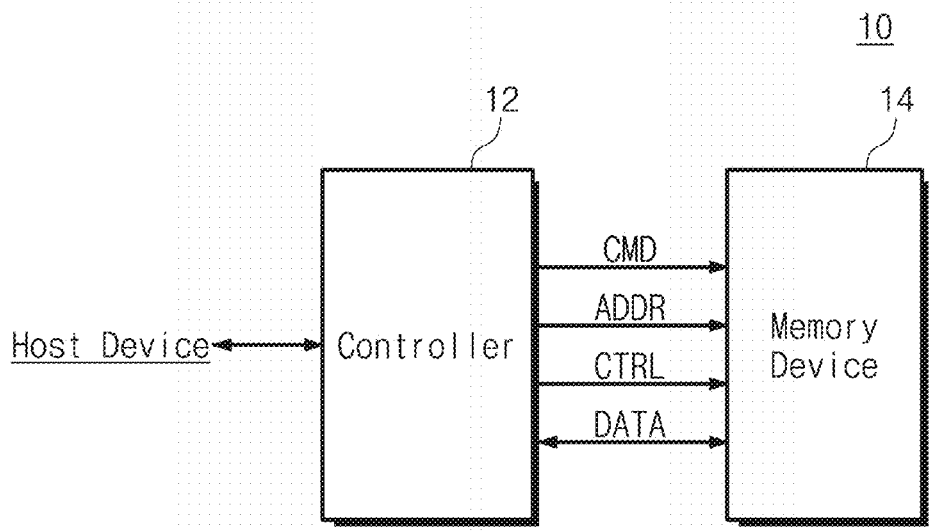
FIG. 1 is a diagram illustrating a configuration of a storage device according to an example embodiment of the present disclosure.

FIG. 1 is a diagram illustrating a configuration of a storage device according to an example embodiment of the present disclosure. A storage device 10 may include a controller 12 and a memory device 14. Although not illustrated in drawings, the storage device 10 may further include a buffer which temporarily stores data read from the memory device 14 or data to be stored in the memory device 14.

The controller 12 may control a read operation and a write operation of the memory device 14. To this end, the controller 12 may transmit a command CMD, an address ADDR, and a control signal CTRL to the memory device 14. In response to signals received from the controller 12, the memory device 14 may store data "DATA" from the controller 12 or provide data to the controller 12. Further, the controller 12 may generate an error correction code for write data to be stored in the memory device 14, and may perform error detection and correction on read data read from the memory device 14.

The memory device 14 may be configured to store and output data. The memory device 14 may include a memory cell implemented by using, for example, a variable resistance element. The variable resistance element may refer to an element in which data are determined according to a variable resistance value.

In an example embodiment, the memory device 14 may include spin transfer torque magneto resistive RAM (STT-MRAM) cells. In this case, each of the memory cells included in the memory device 14 may include a magnetic tunnel junction (MTJ) element having a magnetic material.

In an example embodiment, the memory device 14 may include phase-change random access memory (PRAM) cells. In this case, each of the memory cells included in the memory device 14 may include an element formed of a phase-change material. For example, the phase-change material may include a chalcogenide material (i.e., a GST material) containing germanium (Ge), antimony (Sb), and/or tellurium (Te).

In an example embodiment, the memory device 14 may include a resistive RAM (ReRAM). In this case, each of the memory cells included in the memory device 14 may include an element formed of perovskite and/or transition metal oxide.

However, memory devices 14 according to the present inventive concepts are not limited to the above-described elements. The memory device 14 of the present disclosure may be understood as including various kinds of variable resistance elements in which data are determined according to a variable resistance value. For ease of description, the term "variable resistance element VR" may be used in the specification, however, the term should be understood as including various kinds off elements described above.

Meanwhile, the storage device 10 may constitute an electronic device together with a host device. For example, the electronic device may be a smartphone or a wearable device. In this case, the host device may perform operations (e.g., read and write operations) to operate the storage device 10.

For example, the host device may include a main processor (e.g., a central processing unit (CPU) or an application processor (AP)), a dedicated processor (e.g., a graphic processing unit (GPU) or a Modulator/Demodulator (MODEM)), or an image sensor.

Figure 2:
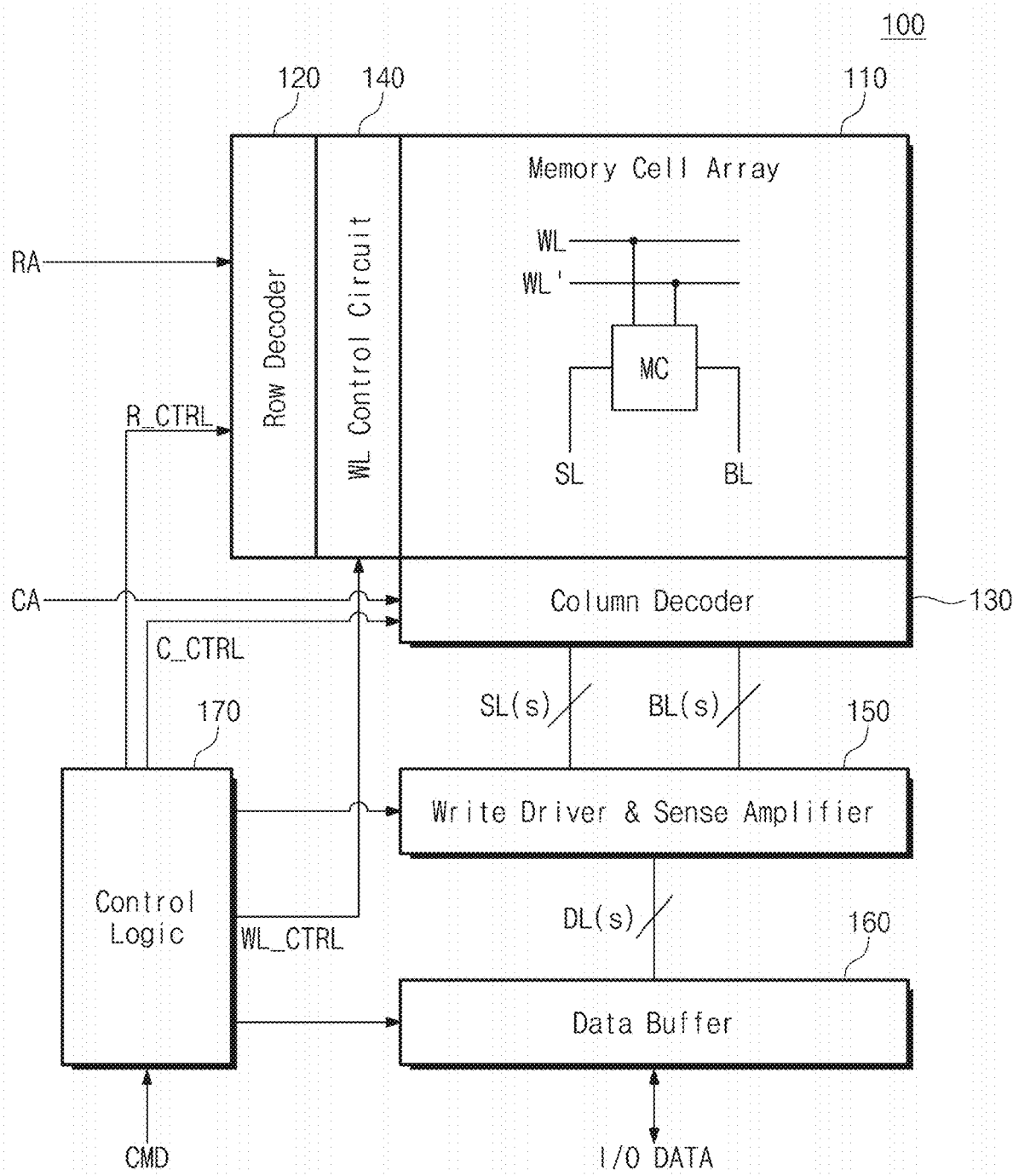
FIG. 2 is a diagram illustrating an example configuration of a memory device of FIG. 1.

FIG. 2 is a diagram illustrating an example configuration of the memory device 14 of FIG. 1. A memory device 100 includes a memory cell array 110, a row decoder 120, a column decoder 130, a word line control circuit 140, a write driver and sense amplifier 150, a data buffer 160, and control logic 170.

The memory cell array 110 may include variable resistance memory cells implemented with variable resistance elements. As described above, the variable resistance memory cells may include STT-MRAM cells, PRAM cells, ReRAM cells, etc. However, in an embodiment, it is assumed that the memory cell array 110 includes STT-MRAM cells.

Each memory cell MC in the memory cell array 110 may be configured to perform an asymmetric write operation. To this end, each memory cell MC may include one variable resistance element and two cell transistors. In each memory cell MC, the two cell transistors each may be connected to a word line WL and a sub word line WL'. For example, in a bit line write operation, one of the word line WL and the sub word line WL' may be driven with regard to the memory cell MC. In a source line write operation, both the word line WL and the sub word line WL' may be driven with regard to the memory cell MC. A structure of the memory cell MC and the asymmetric write operation of the present disclosure will be more fully described later.

The row decoder 120 may receive a row address RA and a row control signal R_CTRL, and may decode the row address RA. The row decoder 120 may select and drive the word line WL connected to a memory cell MC in which a read operation or a write operation is performed, based on the row address RA and the row control signal R_CTRL. That is, the row decoder 120 may provide a driving voltage to the word line WL.

The column decoder 130 may receive a column address CA and a column control signal C_CTRL, and may decode the column address CA. The column decoder 130 may select and drive a bit line BL and a source line SL connected to the memory cell MC in which the read operation or the write operation is performed, based on the column address CA and the column control signal C_CTRL.

The word line control circuit 140 may support the asymmetric write operation based on a word line control signal WL_CTRL. For example, in the bit line write operation, the word line control circuit 140 may perform a switching operation such that the word line WL is driven. In the source line write operation, the word line control circuit 140 may perform a switching operation such that the word line WL and the sub word line WL' are driven.

In the write operation, the write driver and sense amplifier 150 may provide write data to a memory cell selected by the row decoder 120 and the column decoder 130. The write driver and sense amplifier 150 may receive data from the data buffer 160, and may drive the bit line BL and/or the source line SL connected to the column decoder 130 based on the received data. That is, the write driver and sense amplifier 150 may provide a driving voltage (e.g., bit line voltage or source line voltage) to the bit line BL and/or the source line SL.

In the read operation, the write driver and sense amplifier 150 may sense data stored in a memory cell selected by the row decoder 120 and the column decoder 130. For example, the write driver and sense amplifier 150 may compare a voltage of the bit line BL connected to the selected memory cell and a voltage of a reference bit line (not illustrated), and may amplify a difference corresponding to the comparison result. The write driver and sense amplifier 150 may latch a voltage corresponding to the amplified difference and may determine data.

The data buffer 160 may store write data received from the outside or read data read from the memory cell array 110. The data buffer 160 may include a deserializer (not illustrated) for deserializing the write data and a serializer (not illustrated) for serializing the read data.

The control logic 170 may decode a command received from the outside. For example, the control logic 170 may decode an activate command, a write command, a read command, a precharge command, etc. For example, the control logic 170 may generate the row control signal R_CTRL based on the activate command or the precharge command for controlling the row decoder 120. For example, the control logic 170 may generate the column control signal C_CTRL based on the write command or the read command for controlling the column decoder 130. For example, the control logic 170 may generate the word line control signal WL_CTRL based on the write command for controlling the word line control circuit 140.

Figure 3:
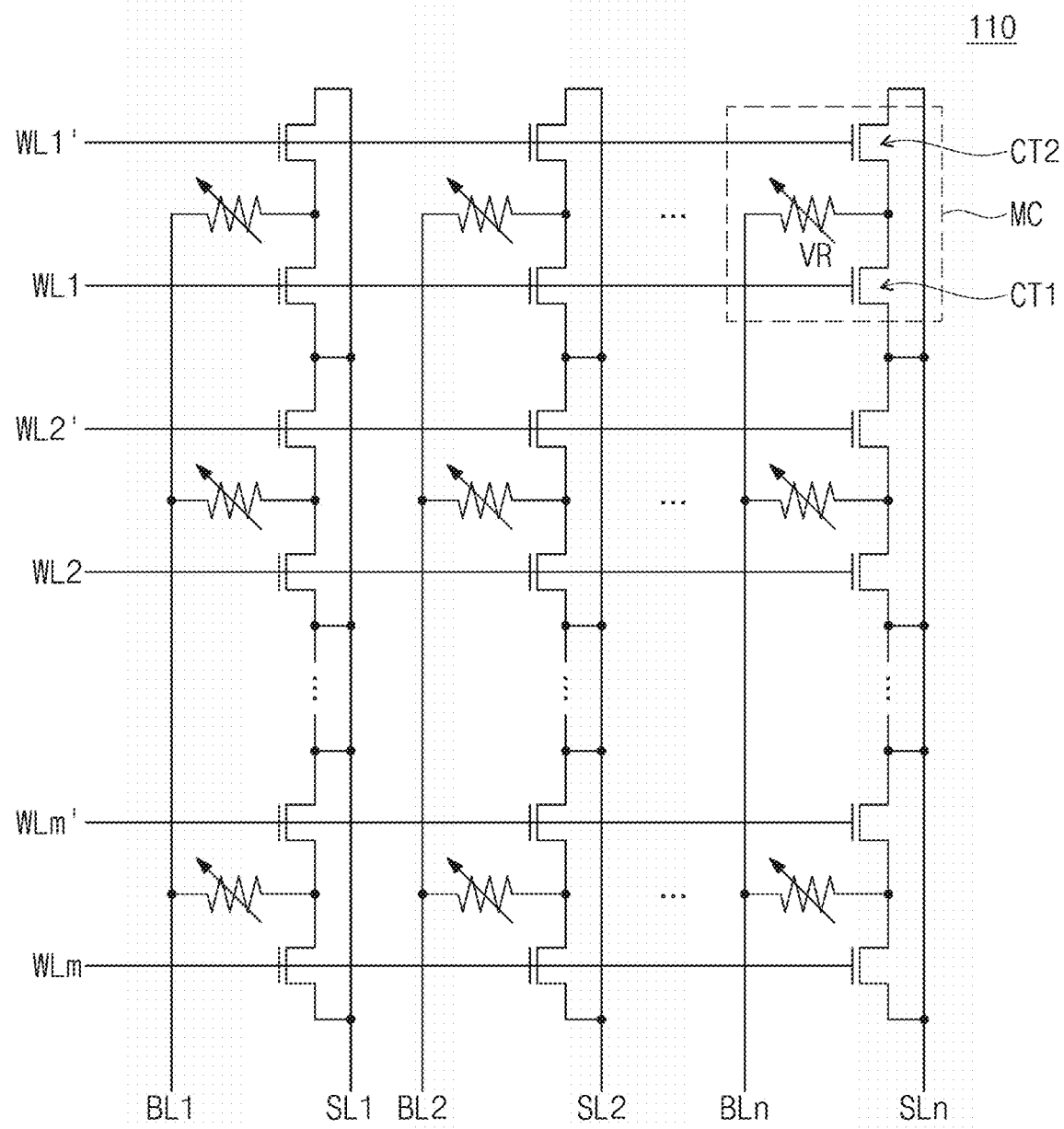
FIG. 3 is a diagram illustrating a configuration of a memory cell array of FIG. 2.

FIG. 3 is a diagram illustrating a configuration of the memory cell array 110 of FIG. 2.

The memory cell array 110 may include a plurality of memory cells MC arranged along row and column directions. Each memory cell MC may include a variable resistance element VR and two cell transistors CT1 and CT2. In an embodiment, the variable resistance element VR is a magnetic tunnel junction element. According to some example embodiments, variable resistance element VR are not limited to the magnetic tunnel junction elements as long as a resistance value of the variable resistance element VR varies with a magnitude and a direction of a current (or a voltage) provided to the variable resistance element VR. The resistance value may be maintained even though a current (or voltage) is not provided to the variable resistance element VR. That is, the variable resistance element VR may have a nonvolatile characteristic.

The memory cell MC may have a structure in which the two cell transistors CT1 and CT2 share one variable resistance element VR. One end (or a first end) of the variable resistance element VR may be connected to a bit line (e.g., BLn), and the other end (or a second end) thereof may be connected to one ends of the cell transistors CT1 and CT2. The other ends of the cell transistors CT1 and CT2 may be connected to a source line (e.g., SLn). A gate electrode of the first cell transistor CT1 may be connected to a word line (e.g., WL1), and a gate electrode of the second cell transistor CT2 may be connected to a sub word line (e.g., WL1'). Each of the cell transistors CT1 and CT2 may be switched on or switched off by a signal provided through the corresponding word line and/or the corresponding sub word line.

Meanwhile, word lines WL1 to WLm may be connected to the row decoder 120 (refer to FIG. 2) through the word line control circuit 140 (refer to FIG. 2). As will be described later, sub word lines WL1' to WLm' may be connected to the word lines WL1 to WLm, respectively, under control of the word line control signal WL_CTRL (refer to FIG. 2). For example, in the bit line write operation, the sub word lines WL1' to WLm' may not be connected to the word lines WL1 to WLm, respectively. In the source line write operation, the sub word lines WL1' to WLm' may be connected to the word lines WL1 to WLm, respectively.

Figure 4:
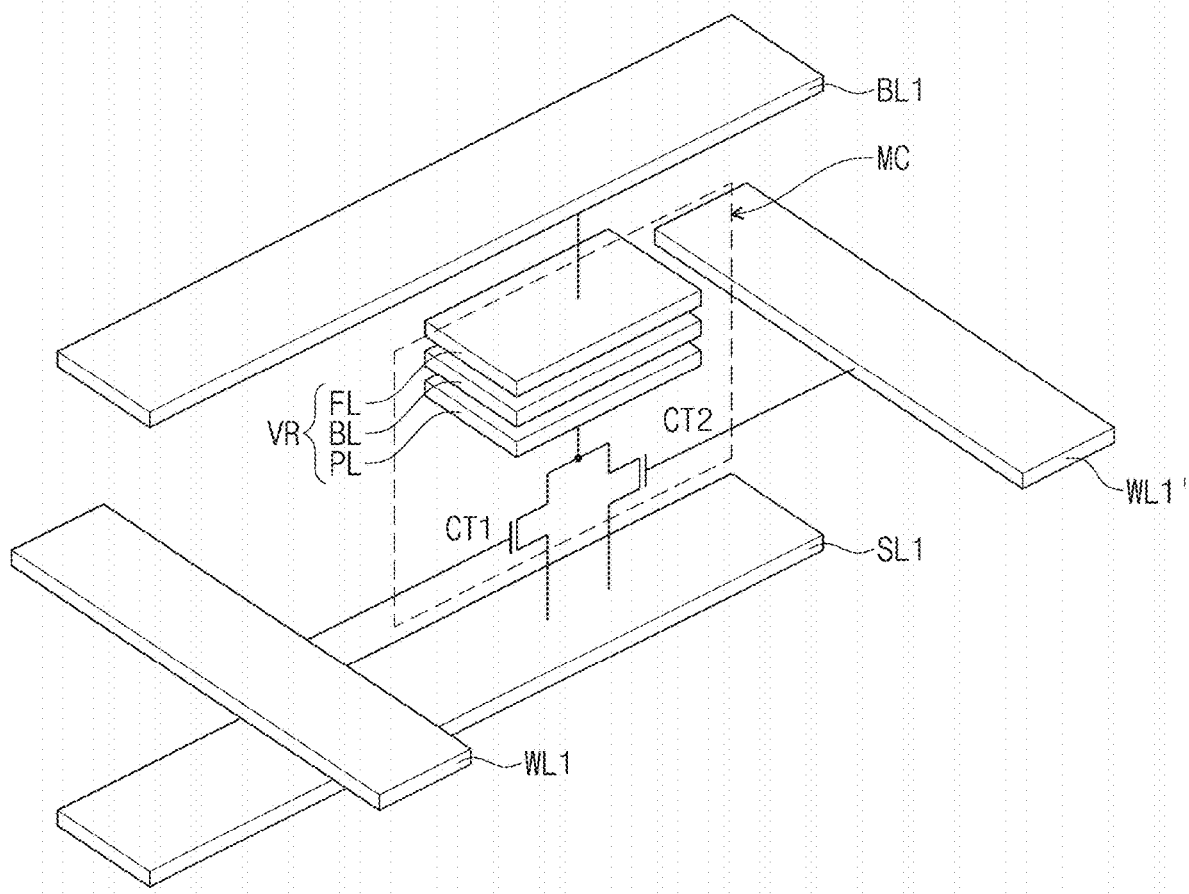
FIG. 4 is a diagram illustrating an example configuration of a memory cell of FIG. 2 or 3.

FIG. 4 is a diagram illustrating an example configuration of the memory cell MC of FIG. 2 or 3. The memory cell MC may include the variable resistance element VR and the cell transistors CT1 and CT2.

A gate electrode of the first cell transistor CT1 may be connected to a word line (e.g., a first word line WL1), and one end of the first cell transistor CT1 may be connected to a bit line (e.g., a first bit line BL1) through the variable resistance element VR. The other end of the first cell transistor CT1 may be connected to a source line (e.g., a first source line SL1).

A gate electrode of the second cell transistor CT2 may be connected to a sub word line (e.g., a first sub word line WL1'), and one end of the second cell transistor CT2 may be connected to the bit line (e.g., the first bit line BL1) through the variable resistance element VR. The other end of the second cell transistor CT2 may be connected to the source line (e.g., the first source line SL1).

The variable resistance element VR may include a pinned layer PL, a free layer FL, and a barrier layer BL (or a tunneling layer) interposed between the pinned layer PL and the free layer FL. A magnetization direction of the pinned layer PL may be fixed, and a magnetization direction of the free layer FL may be identical or opposite to the magnetization direction of the pinned layer PL depending on a condition. The memory cell MC may further include, for example, an anti-ferromagnetic layer (not illustrated) for fixing the magnetization direction of the pinned layer PL.

The free layer FL may include a material, a magnetization direction of which is variable. The magnetization direction of the free layer FL may be changed by an electrical/magnetic factor provided from the outside and/or the inside of the memory cell MC. The free layer FL may include a ferromagnetic material which contains at least one of cobalt (Co), iron (Fe), or nickel (Ni). For example, the free layer FL may include at least one of FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

Barrier layer BL may have a thickness thinner than a spin diffusion distance. The barrier layer BL may include a nonmagnetic material. For example, the barrier layer BL may include at least one of magnesium (Mg), titanium (Ti), aluminum (Al), oxide of magnesium-zinc (MgZn) or magnesium-boron (MgB), or nitride of titanium (Ti) or vanadium (V).

The pinned layer PL may have a magnetization direction fixed by the anti-ferromagnetic layer. The pinned layer PL may include a ferromagnetic material. For example, the pinned layer PL may include at least one of CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, or $Y_3Fe_5O_{12}$.

The anti-ferromagnetic layer (not illustrated) may include an anti-ferromagnetic material. For example, the anti-ferromagnetic layer may include at least one of PtMn, IrMn, MnO, MnS, MnTe, $MnF_2$, $FeCl_2$, FeO, $CoCl_2$, CoO, $NiCl_2$, NiO, or Cr.

In a read operation associated with the memory cell MC, a voltage of a logic high level may be applied to the first word line WL1, and thus the first cell transistor CT1 may be turned on. To measure a resistance value of the variable resistance element VR, a read current may be provided between the first bit line BL1 and the first source line SL1. Data stored in the variable resistance element VR may be determined based on the measured resistance value.

In a write operation associated with the memory cell MC, a voltage of a logic high level may be applied to the first word line WL1 or may be applied to the first word line WL1 and the first sub word line WL1', and thus, the first cell transistor CT1 or the first and second cell transistors CT1 and CT2 may be turned on. To change a resistance value of the variable resistance element VR, a write current may be provided between the first bit line BL1 and the first source line SL1.

Figure 5:
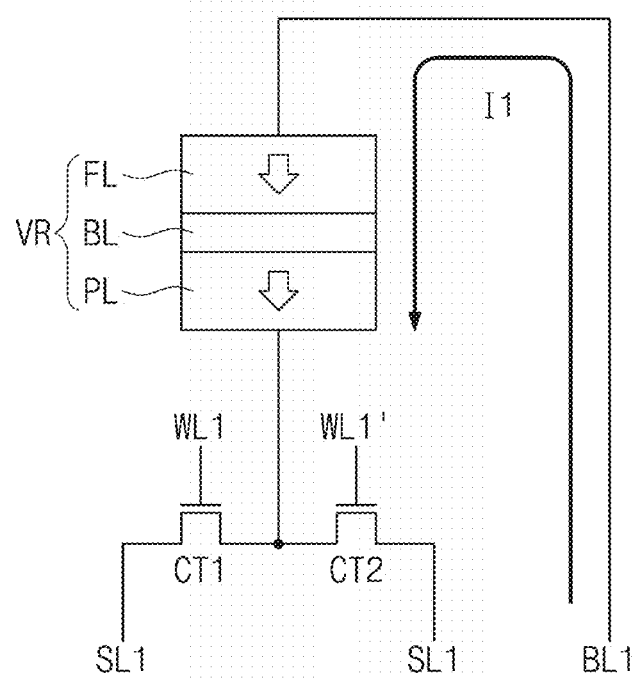
FIGS. 5 and 6 are diagrams illustrating magnetization directions of a variable resistance element determined according to data stored in a memory cell of FIG. 4.
Figure 6:
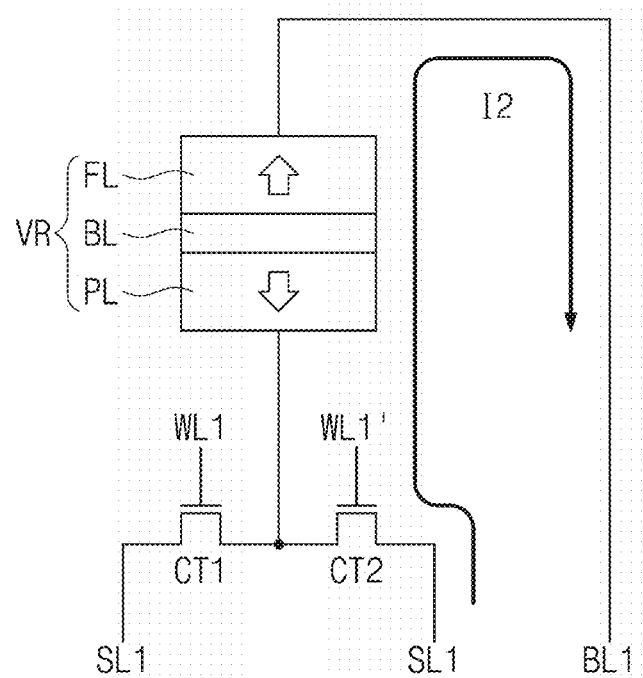

FIGS. 5 and 6 are diagrams illustrating magnetization directions of a variable resistance element VR determined according to data stored in a memory cell of FIG. 4.

In an example embodiment, FIG. 5 shows the bit line write operation. In the bit line write operation, as a bit line voltage is applied to the first bit line BL1 and a ground voltage is applied to the first source line SL1, a first write current I1 may flow. In this case, a magnetization direction of the free layer FL and a magnetization direction of the pinned layer PL may become identical to each other (i.e., in parallel), and thus, a resistance value of the variable resistance element VR may decrease. For example, the bit line write operation may correspond to a program operation for logic "0".

In an example embodiment, FIG. 6 shows the source line write operation. In the source line write operation, as a source line voltage is applied to the first source line SL1 and the ground voltage is applied to the first bit line BL1, a second write current I2 may flow. In this case, a magnetization direction of the free layer FL and a magnetization direction of the pinned layer PL may become opposite to each other (i.e., anti-parallel), and thus, a resistance value of the variable resistance element VR may increase. For example, the source line write operation may correspond to a program operation for logic "1".

Data of a memory cell may be switched between a first value (e.g., logic "0") and a second value (e.g., logic "1") depending on a direction of a write current which is driven by the write driver and sense amplifier 150 (refer to FIG. 2). For example, in the case where the second write current I2 is applied to a memory cell in which the first value is stored, a value stored in the memory cell may be switched from the first value to the second value. In contrast, in the case where the first write current I1 is applied to a memory cell in which the second value is stored, a value stored in the memory cell may be switched from the second value to the first value.

Conventionally, in the source line write operation associated with a memory cell including one cell transistor and one variable resistance element VR, a gate-source voltage of the cell transistor may decrease due to a resistance of the variable resistance element VR connected to a source electrode of the cell transistor, thereby causing a reduction of current driving capability tin the source line write operation.

As illustrated in FIGS. 5 and 6, the two cell transistors CT1 and CT2 may be used to increase current driving capability during the source line write operation. However, the use of the two cell transistors CT1 and CT2 may generate an over-current in the bit line write operation. This may cause undesirable excess power consumption, a write error due to back hopping switching, and/or a decrease in durability.

Figure 7:
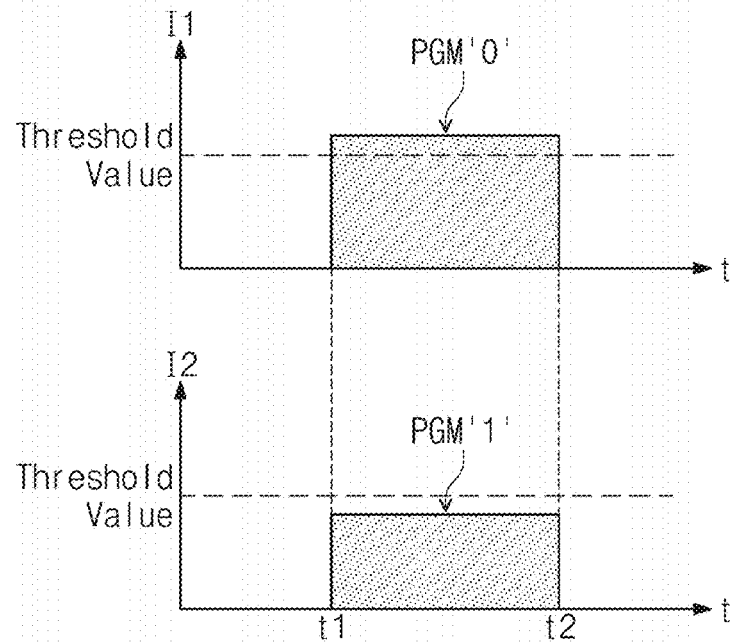
FIG. 7 shows graphs illustrating characteristics of a bit line write operation and a source line write operation.

FIG. 7 shows graphs illustrating characteristics of a bit line write operation and a source line write operation. For better understanding, a description will be given with reference to FIG. 5 together.

In an example embodiment, an operation of programming the first value (e.g., logic "0") to a memory cell may correspond to the bit line write operation, and an operation of programming the second value (e.g., logic "1") to a memory cell may correspond to the source line write operation.

In the bit line write operation, a current of a threshold value or more may be applied during a time from t1 to t2 for the purpose of programming the first value (e.g., logic "0") to the memory cell. In FIG. 7, a horizontal axis of a graph denotes a time spent to program the first value to the memory cell. In FIG. 7, a vertical axis of the graph denotes a current value used to program the first value to the memory cell. The amount of charges corresponding to the area of a shaded box may be enough to perform the bit line write operation or may be enough to switch from the second value (e.g., logic "1") to the first value (e.g., logic "0").

In the case where a write voltage to be applied to the first bit line BL is set to a reference voltage in the bit line write operation, due to the decrease in the gate-source voltages of the cell transistors CT1 and CT2 described above, the reference voltage may be insufficient to perform the source line write operation. This is conceptually illustrated as a value of the second write current I2 being lower than a threshold value in the source line write operation.

Figure 8:
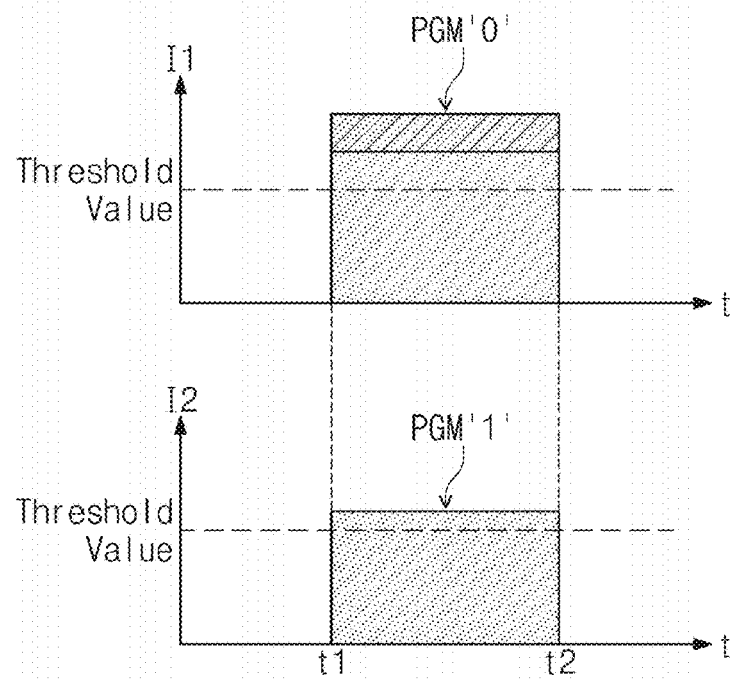
FIG. 8 shows graphs illustrating other characteristics of a bit line write operation and a source line write operation.

FIG. 8 shows graphs illustrating other characteristics of a bit line write operation and a source line write operation. For better understanding, a description will be given with reference to FIG. 6 together.

In an example embodiment, an operation of programming the first value (e.g., logic "0") to a memory cell may correspond to the bit line write operation, and an operation of programming the second value (e.g., logic "1") to a memory cell may correspond to the source line write operation.

In the case where a write voltage applied to the source line SL1 to successfully program the second value (e.g., logic "1") in the source line write operation is set to a reference voltage, the reference voltage may be excessive to perform the bit line write operation. This is conceptually illustrated as a value of the first write current I1 exceeds the threshold value in the bit line write operation (e.g., a hatched portion). The over-current may cause undesirable excess power consumption, a write error due to back hopping switching, and/or a decrease in durability.

Figure 9:
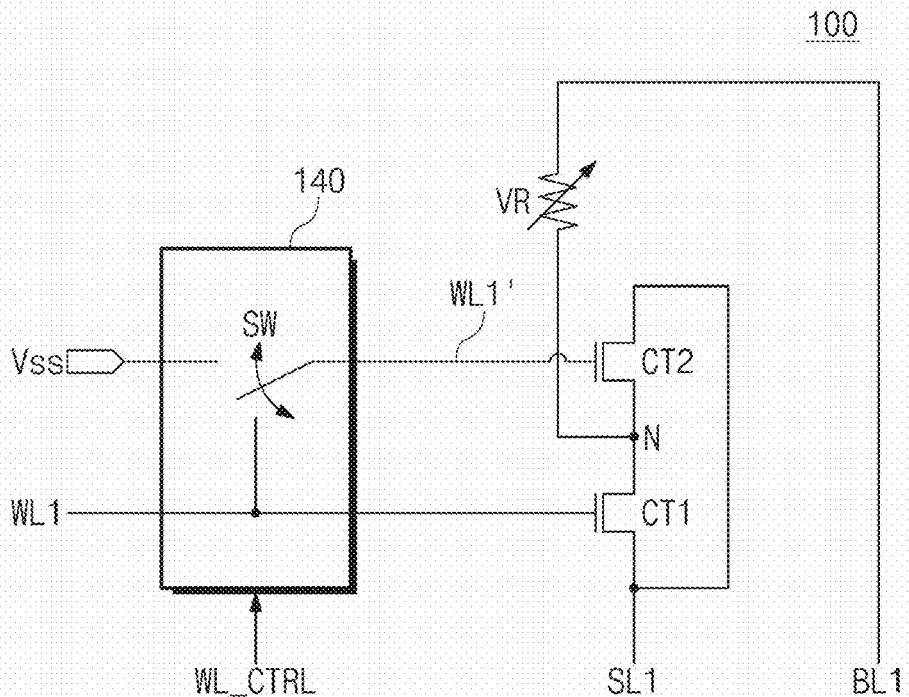
FIG. 9 is a diagram illustrating a part of a memory device according to an example embodiment of the present disclosure.

FIG. 9 is a diagram illustrating a part of a memory device according to an example embodiment of the present disclosure. For brevity of illustration, the word line control circuit 140 and one memory cell are illustrated.

The memory cell may include the variable resistance element VR and the cell transistors CT1 and CT2. In FIG. 9, "N" indicates a common node to which the variable resistance element VR, the first cell transistor CT1, and the second cell transistor CT2 are connected in common. A path passing through the first bit line BL1, the variable resistance element VR, the common node "N", the first cell transistor CT1, and the first source line SL1 may be referred to as a "first path". A path passing through the first bit line BL1, the variable resistance element VR, the common node "N", the second cell transistor CT2, and the first source line SL1 may be referred to as a "second path".

The word line control circuit 140 may be configured to control the cell transistors CT1 and CT2. In an example embodiment, the word line control circuit 140 may include a switching element SW which is configured to be switched under control of the word line control signal WL_CTRL. For example, the switching element SW may include, but is not limited to, one or more transistors.

In the bit line write operation, the word line control circuit 140 may controls cell transistors CT1 and CT2 such that only one of the cell transistors CT1 and CT2 to be turned on. For example, a power supply voltage $V_{SS}$ may be provided to the gate electrode of the second cell transistor CT2 by appropriately switching the switching element SW in the bit line write operation. Here, the power supply voltage $V_{SS}$ may be a voltage (e.g., a ground voltage) for turning off the second cell transistor CT2.

As only one cell transistor (e.g., the first cell transistor CT1) of the cell transistors CT1 and CT2 is turned on, a current flows only through the first path. That is, since a small amount of current flows compared with the case where both the cell transistors CT1 and CT2 are turned on and thus a current flows through the first path and the second path, an over-current from the first bit line BL1 to the variable resistance element VR may be mitigated or prevented.

In the source line write operation, the word line control circuit 140 may controls cell transistors CT1 and CT2 such that both the cell transistors CT1 and CT2 to be turned on. For example, by appropriately switching the switching element SW in the source line write operation, the first sub word line WL1' may be connected to the first word line WL1, and a word line voltage may be provided to the gate electrodes of the cell transistors CT1 and CT2. Here, the word line voltage may be a voltage sufficient for turning on the cell transistors CT1 and CT2.

As both the cell transistors CT1 and CT2 are turned on, a current flows through both the first path and the second path. Because the intensity of a current flowing from the first source line SL1 to the variable resistance element VR increases, a decrease of a driving capacity due to a decrease in a gate-source voltage of the cell transistors CT1 and CT2 may be mitigated or prevented.

Meanwhile, the word line control circuit 140 is illustrated in FIGS. 2 and 9 as a component independent of the row decoder 120. However, according to some example embodiments, the word line control circuit 140 may be included in the row decoder 120. That is, the word line control circuit 140 and the row decoder 120 may be implemented as functional units of one component.

Figure 10:
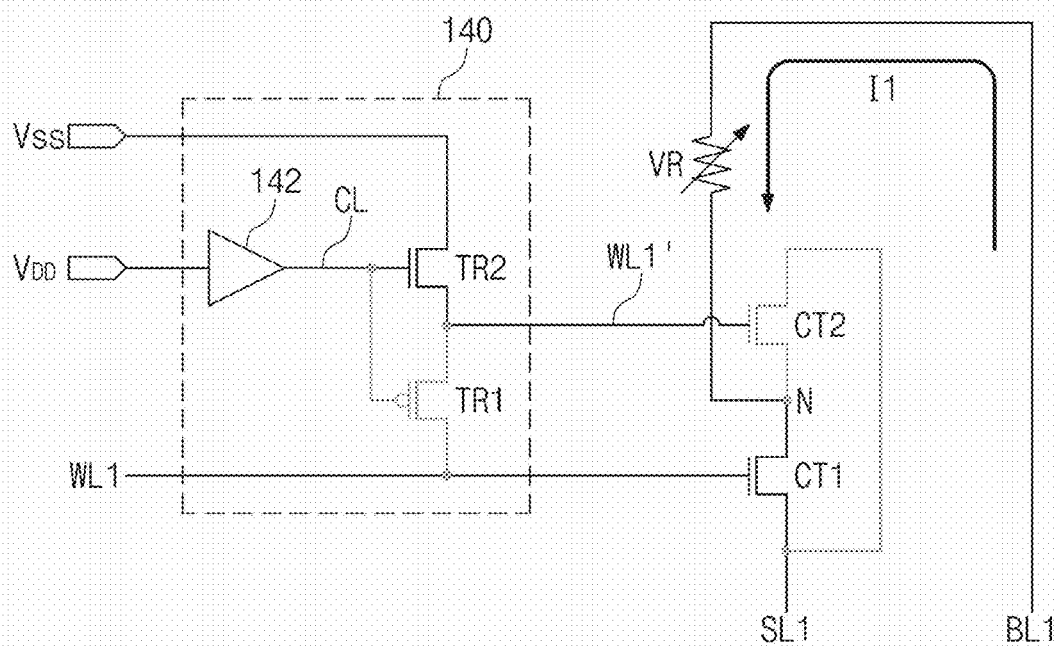
FIGS. 10 to 11 are diagrams illustrating example configurations of a word line control circuit of FIG. 9.
Figure 11:
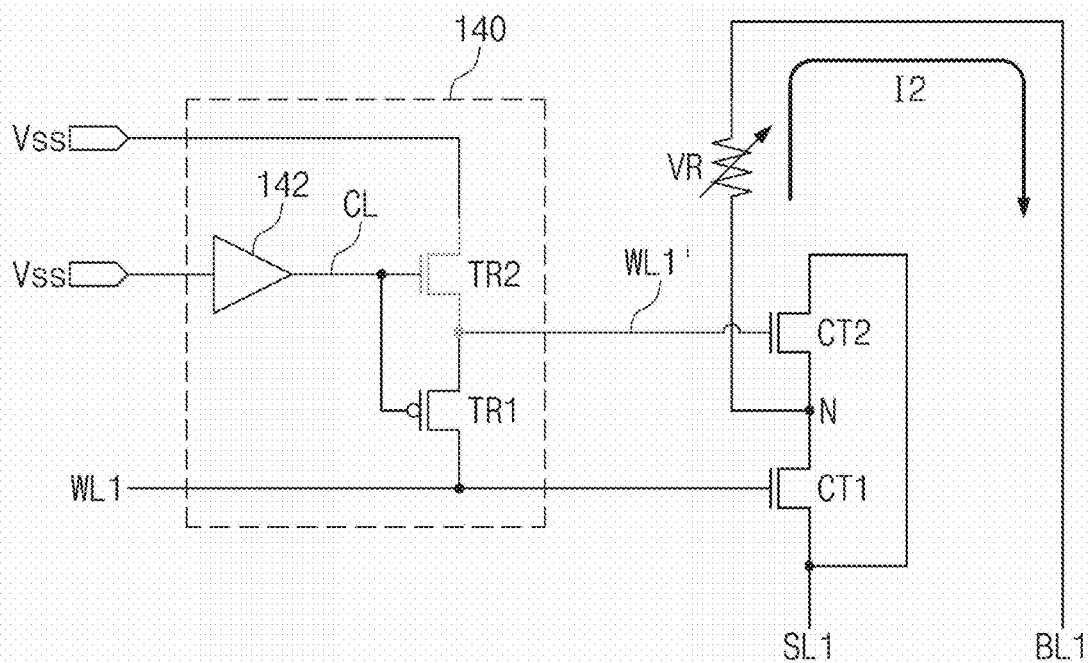

FIGS. 10 to 11 are diagrams illustrating example configurations of a word line control circuit of FIG. 9. In an example embodiment, the word line control circuit 140 includes a level shifter 142, a first control transistor TR1, and a second control transistor TR2.

The level shifter 142 may be configured to shift a first power supply voltage $V_{DD}$ to an appropriate voltage level. Here, the appropriate voltage level may mean a voltage level suitable to turn on or turn off the control transistors TR1 and TR2. For example, the first power supply voltage $V_{DD}$ may be a bit line voltage to be supplied to the first bit line BL1. The level shifter 142 may shift the bit line voltage to a level of the word line voltage to be supplied to the first word line WL1. The level shifter 142 may be configured to receive and output a second power supply voltage $V_{SS}$ without modification. In this case, the second power supply voltage $V_{SS}$ may be the ground voltage. The shifted voltage is applied to a gate electrode of the first control transistor TR1 and/or a gate electrode of the second control transistor TR2 through a common line CL.

The gate electrodes of the first and second control transistors TR1 and TR2 may be connected to an output terminal of the level shifter 142. One end of the first control transistor TR1 may be connected to the first word line WL1, and one end of the second control transistor TR2 may be connected to the second power supply voltage $V_{SS}$. The other end of the first control transistor TR1 and the other end of the second control transistor TR2 may be connected in common to the first sub word line WL1'. The first word line WL1 may be connected to the gate electrode of the first cell transistor CT1, and the first sub word line WL1' may be connected to the gate electrode of the second cell transistor CT2. For example, when the first control transistor TR1 may be a PMOS transistor, and the second control transistor TR2 may be an NMOS transistor.

An operation of the word line control circuit 140 in the bit line write operation is illustrated in FIG. 10. As described above, according to the bit line write operation of the present disclosure, only one (e.g., the first cell transistor CT1) of the cell transistors CT1 and CT2 is turned on to mitigate or prevent a level of the first write current I1 from becoming excessively high.

The level shifter 142 may shift the first power supply voltage $V_{DD}$ to an appropriate voltage level (e.g., a word line voltage). As the shifted voltage is applied to the gate electrode of the first control transistor TR1, the first control transistor TR1 may be turned off. In this case, the first word line WL1 may be electrically separated (or isolated) from the first sub word line WL1'. As such, the second power supply voltage $V_{SS}$ may be applied to the gate electrode of the second cell transistor CT2, and thus, the second cell transistor CT2 may be turned off.

Further, as the first control transistor TR1 is turned off, the word line voltage provided to the first word line WL1 is applied only to the first cell transistor CT1, and thus the first cell transistor CT1 is turned on. As such, the first write current I1 flows to the first source line SL1 through the first cell transistor CT1, without being flowing through the second cell transistor CT2.

In FIG. 11, an operation of the word line control circuit 140 in the source line write operation is illustrated. As described above, according to the source line write operation of the present disclosure, all the cell transistors CT1 and CT2 may be turned on to mitigate or prevent a level of the second write current I2 from decreasing.

The level shifter 142 may receive and output the second power supply voltage $V_{SS}$. When the second power supply voltage $V_{SS}$ is applied to the gate electrodes of the second and second control transistors TR2, the second control transistor TR2 may be turned off. In this case, the first sub word line WL1' is electrically separated (or isolated) from the second power supply voltage $V_{SS}$. Further, when the second power supply voltage $V_{SS}$ is applied to the gate electrode of the first control transistor TR1, the first control transistor TR1 may be turned on. In this case, the word line WL1 may be electrically connected with the first sub word line WL1'.

The word line voltage supplied through the first word line WL1 may be applied to the gate electrode of the first cell transistor CT1, and thus the first cell transistor CT1 may be turned on. Further, because the word line voltage supplied through the first word line WL1 is applied to the gate electrode of the second cell transistor CT2 through the first sub word line WL1', the second cell transistor CT2 may be turned on. Accordingly, the second write current I2 may flow to the first bit line BL1 through the first cell transistor CT1 and the second cell transistor CT2.

Figure 12:
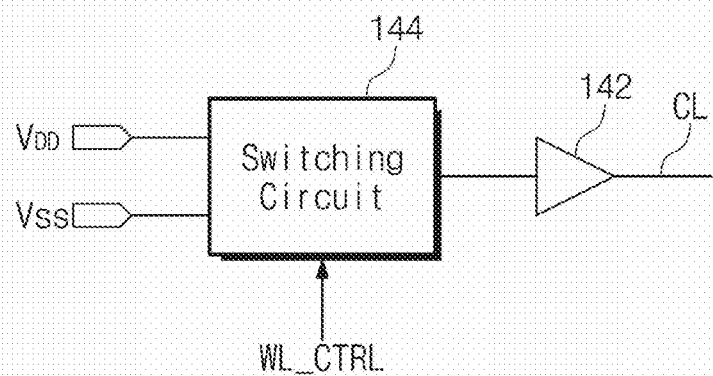
FIG. 12 is a diagram illustrating a switching circuit included in a word line control circuit of FIGS. 10 and 11.

The level shifter 142 provided in the word line control circuit 140 not limited to the one illustrated in FIGS. 10 and 11, but may be one of various logic elements (e.g., an inverter and an inverter chain), which are configured to change a voltage level FIG. 12 is a diagram illustrating a switching circuit included in a word line control circuit of FIGS. 10 and 11. For better understanding, the level shifter 142 and the common line CL of FIGS. 10 and 11 are illustrated together. For better understanding, a description will be given with reference to FIGS. 10 and 11 together.

A switching circuit 144 may be configured to select the first power supply voltage $V_{DD}$ or the second power supply voltage $V_{SS}$ in response to the word line control signal WL_CTRL. For example, the switching circuit 144 may be implemented variously by using a transistor or a multiplexer. In an example embodiment, in the case where the bit line write operation is performed, the switching circuit 144 may select and output the first power supply voltage $V_{DD}$. In contrast, in the case where the source line write operation is performed, the switching circuit 144 may select and output the second power supply voltage $V_{SS}$.

In an example embodiment, the switching circuit 144 may be implemented as part of the word line control circuit 140. In another example embodiment, the switching circuit 144 may be implemented separately from the word line control circuit 144.

Figure 13:
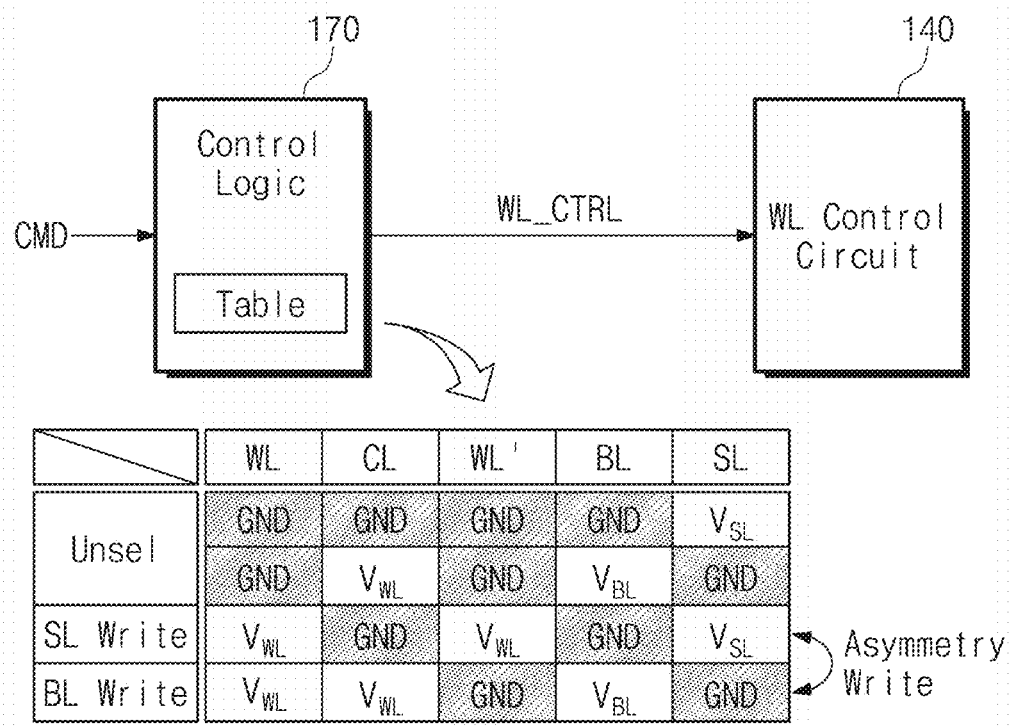
FIG. 13 is a diagram illustrating a voltage output table according to an example embodiment of the present disclosure.

FIG. 13 is a diagram illustrating a voltage output table according to an example embodiment of the present disclosure. For better understanding, a description will be given with reference to FIGS. 10 and 11 together.

In a table, the uppermost row indicates voltages of the word line WL, the common line CL, the sub word line WL', the bit line BL, and the source line SL. The first word line WL1, the first bit line BL1, and the first source line SL illustrated in FIGS. 10 and 11 may be understood as corresponding to the word line WL, the bit line BL, and the source line SL, respectively. In the table, the leftmost column indicates an unselected memory cell Unsel, the source line write operation, and the bit line write operation.

The control logic 170 may generate the word line control signal WL_CTRL based on the command CMD received from the outside (e.g., host). The word line control signal WL_CTRL may include a variety of information desired to perform the bit line write operation and the source line write operation of the present disclosure. For example, as described above, the word line control signal WL_CTRL may control the control transistors TR1 and TR2 such that the first control transistor TR1 to be turned off and the second control transistor TR2 to be turned on in the bit line write operation. The word line control signal WL_CTRL may control the control transistors TR1 and TR2 such that the first control transistor TR1 to be turned on and the second control transistor TR2 to be turned off in the source line write operation.

The control logic 170 may control the word line WL, the bit line BL, and the source line SL based on the voltage table illustrated in FIG. 11. In an example embodiment, the table illustrated in FIG. 11 may be stored in a separate register provided in the control logic 170 or in a separate area of the memory device 14 (refer to FIG. 1).

Referring to the source line write operation of the table, in the source line write operation, a source line voltage $V_{SL}$ and a ground voltage GND may be applied to the source line SL and the bit line BL, respectively. Also, a word line voltage $V_{WL}$ may be applied to the word line WL and the sub word line WL' of a selected memory cell. As described with reference to FIG. 11, the word line voltage $V_{WL}$ may be applied to the sub word line WL' because the second power supply voltage $V_{SS}$ (e.g., the ground voltage GND) is applied to the second control transistor TR2 through the common line CL, and thus the second control transistor TR2 is turned off.

Meanwhile, referring to the bit line write operation of the table, a bit line voltage $V_{BL}$ and the ground voltage GND may be applied to the bit line BL and the source line SL, respectively, in the bit line write operation. Also, the word line voltage $V_{WL}$ and the ground voltage GND may be applied to the word line WL and the sub word line WL' of the selected memory cell, respectively. As described with reference to FIG. 10, the second power supply voltage $V_{SS}$ (e.g., the ground voltage GND) is applied to the sub word line WL' because a shifted first power supply voltage (e.g., a word line voltage) is applied to the second control transistor TR2 through the common line CL, and thus the second control transistor TR2 is turned on.

As described above, according to the asymmetric write operation of the present disclosure, an over-current flowing to a bit line in the bit line write operation may be mitigated or prevented, and a decrease of a driving capability in the source line write operation may be mitigated or prevented.

Figure 14:
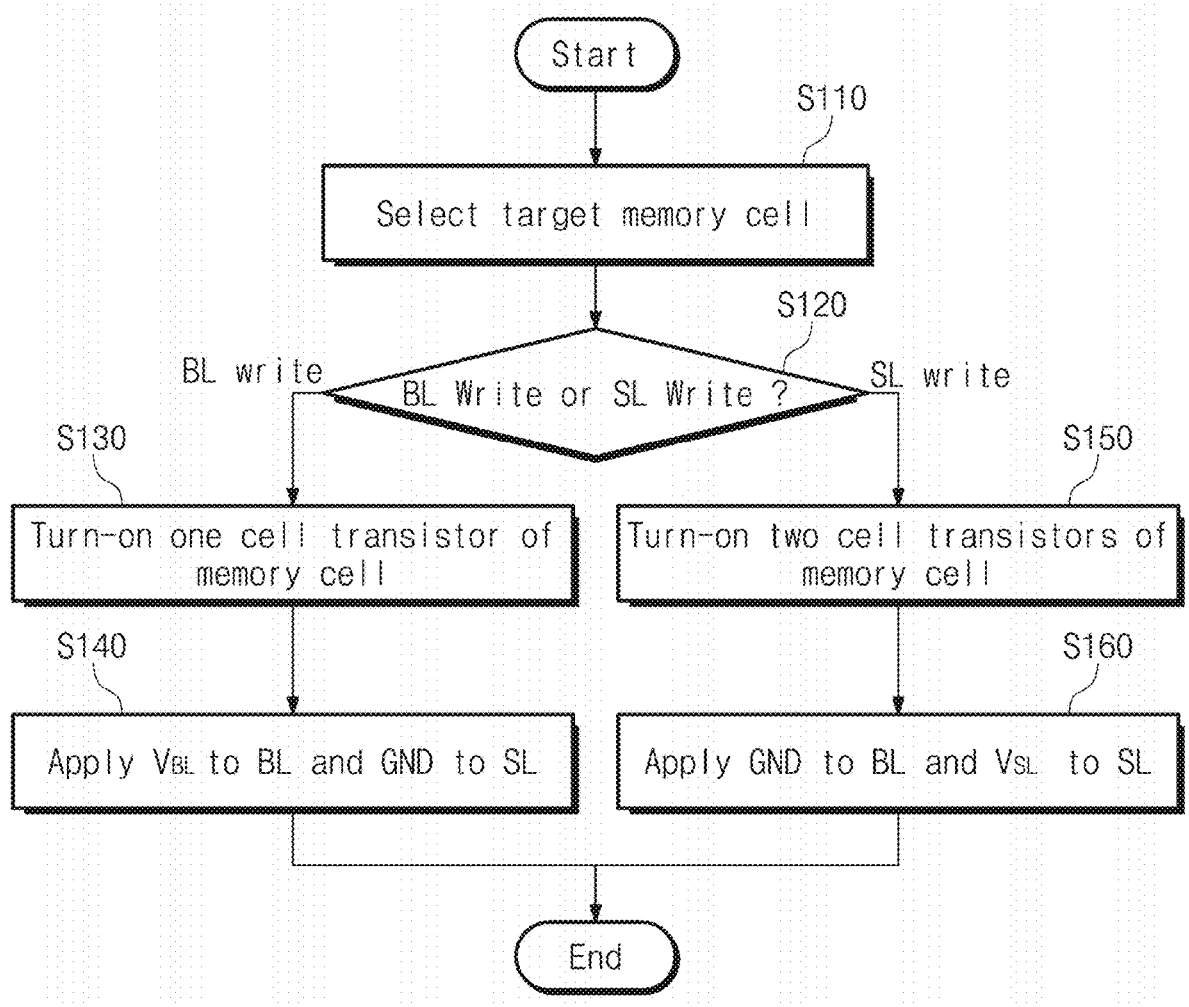
FIG. 14 is a flowchart illustrating an asymmetric write operation according to an example embodiment of the present disclosure.

FIG. 14 is a flowchart illustrating an asymmetric write operation according to an example embodiment of the present disclosure. For better understanding, a description will be given with reference to FIG. 9 together. The first word line WL1, the first bit line BL1, the first source line SL illustrated in FIG. 9 may be understood as corresponding to the word line WL, the bit line BL, the source line SL illustrated in FIG. 14, respectively.

In operation S110, a target memory cell is selected. The target memory cell may be selected by driving a bit line and a source line connected to the target memory cell depending on an address received from the outside.

In operation S120, whether a write operation of the target memory cell is the bit line write operation or the source line write operation is determined. In the case where it is determined that the write operation is the bit line write operation, operation S130 is performed, and in the case where it is determined that the write operation is the source line write operation, operation S150 is performed.

In operation S130, only one of the cell transistors CT1 and CT2 connected to the variable resistance element VR may be turned on. In an example embodiment, the second power supply voltage $V_{SS}$ for turning off the second cell transistor CT2 may be applied to the second cell transistor CT2 by appropriately switching the switching element SW of the word line control circuit 140.

In operation S140, the bit line voltage $V_{BL}$ may be applied to the bit line BL, and the ground voltage GND may be applied to the source line SL. Because only one of the cell transistor CT1 and CT2 is turned on, and thus an over-current which may be generated when a current flows through the two cell transistors CT1 and CT2 may be mitigated or prevented.

In operation S150, one of the cell transistors CT1 and CT2 connected to the variable resistance element VR may be turned on. In an example embodiment, by appropriately switching the switching element SW of the word line control circuit 140, the word line WL and the sub word line WL' may be separated from each other, and thus a word line voltage may be applied to a gate of one of the cell transistors CT1 and CT2.

In operation S160, the ground voltage GND may be applied to the bit line BL, and the source line voltage $V_{SL}$ may be applied to the source line SL. As all the cell transistors CT1 and CT2 are turned on, an insufficient driving capability which may occur when a current flows through only one cell transistor may be mitigated or prevented.

Figure 15:
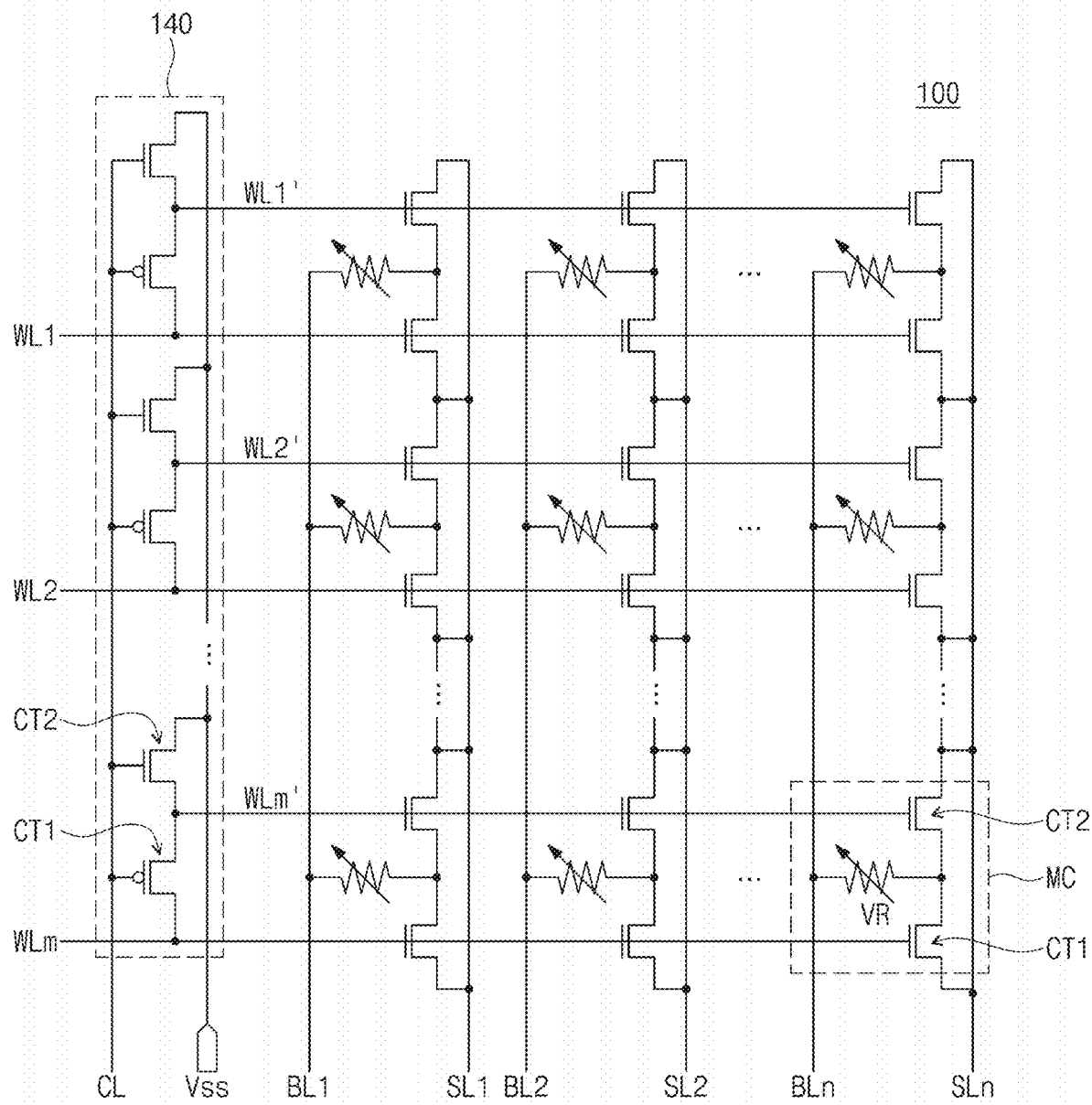
FIG. 15 is a circuit diagram illustrating a memory device according to an example embodiment of the present disclosure.

FIG. 15 is a circuit diagram illustrating a memory device according to an example embodiment of the present disclosure. The memory device 100 may include memory cells arranged along the row and column directions and the word line control circuit 140. The placement and connection relationship of components illustrated in FIG. 15 are described through the above example embodiments, and thus, additional description will be omitted to avoid redundancy.

Figure 16:
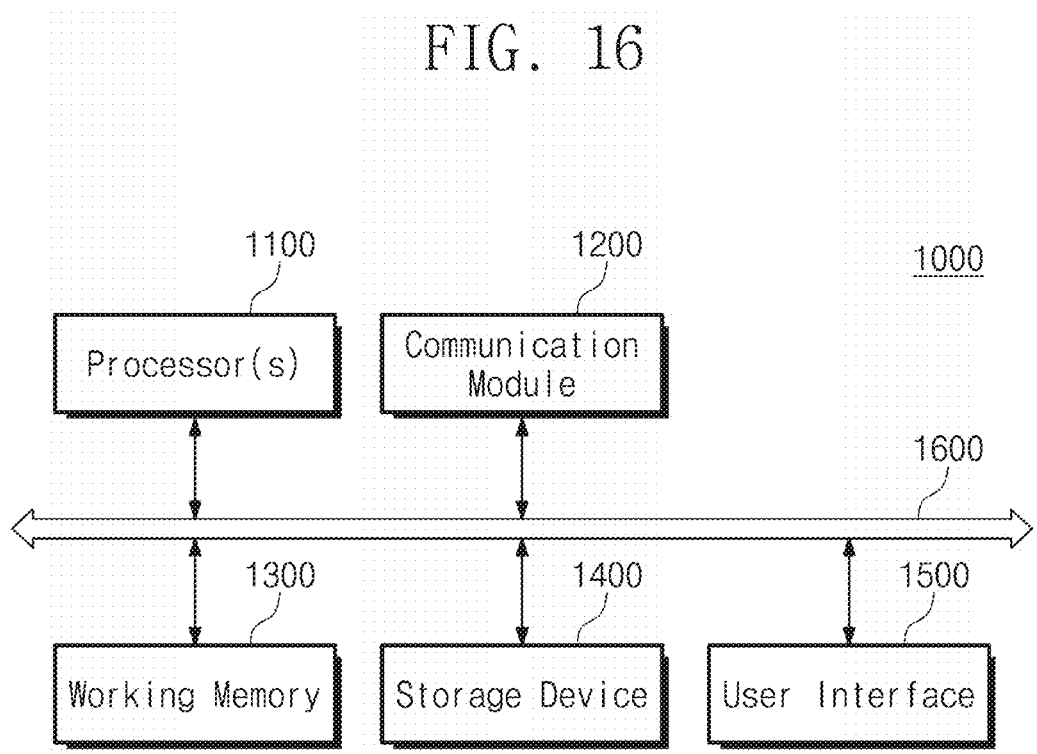
FIG. 16 is a diagram illustrating an electronic system according to an example embodiment of the present disclosure.

FIG. 16 is a diagram illustrating an electronic system 1000 according to an example embodiment of the present disclosure.

The electronic system 1000 may include at least one processor 1100, a communication module 1200, a working memory 1300, a storage device 1400, a user interface 1500, and a bus 1600. For example, the electronic system 1000 may be one of electronic devices such as a desktop computer, a laptop computer, a tablet computer, a smartphone, a wearable device, a video game console, a workstation, a server, and an electric vehicle.

The processor 1100 may control overall operations of the electronic system 1000. The processor 1100 may process various kinds of arithmetic operations and/or logical operations. The processor 1100 may include an application specific integrated circuit (ASIC), a field-programmable gate array (FPGA), a dedicated microprocessor, a microprocessor, etc. For example, the processor 1100 may include one or more processor cores and may be implemented with a general-purpose processor, a special-purpose processor, or an application processor.

The communication module 1200 may communicate with an external device/system of the electronic system 1000. For example, the communication module 1200 may be a function block, a circuit, or a semiconductor chip manufactured independently of the processor 1100. In the case where the processor 1100 is implemented with an application processor, at least a part of functions of the communication module 1200 may be merged in the application processor 1100.

For example, the communication module 1200 may support at least one of various wireless communication protocols (e.g., long term evolution (LTE), worldwide interoperability for microwave access (WiMax), global system for mobile communication (GSM), code division multiple access (CDMA), Bluetooth, near field communication (NFC), wireless fidelity (Wi-Fi), or radio frequency identification (RFID)), and/or at least one of various wired communication protocols (e.g., transfer control protocol/Internet protocol (TCP/IP), universal serial bus (USB), or Firewire).

The working memory 1300 may store data to be used for an operation of the electronic system 1000. For example, the working memory 1300 may temporarily store data processed or to be processed by the processor 1100. For example, the working memory 1300 may include a volatile memory (e.g., a dynamic random access memory (DRAM) or a synchronous DRAM (SDRAM))., and/or a nonvolatile memory (or a phase-change RAM (PRAM), a magneto-resistive RAM (MRAM), a resistive RAM (ReRAM), or a ferroelectric RAM (FRAM)).

The storage device 1400 may include one or more memory devices and a controller. The memory device of the storage device 1400 may store data regardless of power supply. For example, the storage device 1400 may include a nonvolatile memory (e.g., a flash memory, a PRAM, an MRAM, a ReRAM, or an FRAM). For example, the storage device 1400 may include a storage medium (e.g., a solid state drive (SSD), removable storage, or embedded storage).

In particular, in the case where the working memory 1300 or the storage device 1400 includes the variable resistance memory (e.g., an MRAM, a PRAM, or a ReRAM) of the present disclosure, the working memory 1300 or the storage device 1400 may be configured to perform the asymmetric write operation of the present disclosure. As such, an over-current which may be generated in the bit line write operation, and an insufficient driving capability which may occur in the source line write operation may be mitigated or prevented, and thus, the reliability of the write operation may be improved.

The user interface 1500 may perform communication arbitration between a user and the electronic system 1000. For example, the user interface 1500 may include input interfaces (e.g., a keyboard, a mouse, a keypad, a button, a touch panel, a touch screen, a touch pad, a touch ball, a camera, a microphone, a gyroscope sensor, and/or a vibration sensor). For example, the user interface 1500 may include output interfaces (e.g., a liquid crystal display (LCD) device, a light emitting diode (LED) display device, an organic LED (OLED) display device, an active matrix OLED (AMOLED) display device, a speaker, or a motor).

The bus 1600 may provide a communication path between the components of the electronic system 1000. The components of the electronic system 1000 may exchange data with each other based on a bus format of the bus 1600. For example, the bus format may include one or more of various interface protocols such as USB, small computer system interface (SCSI), peripheral component interconnect express (PCIe), mobile PCIe (M-PCIe), advanced technology attachment (ATA), parallel ATA (PATA), serial ATA (SATA), serial attached SCSI (SAS), integrated drive electronics (IDE), enhanced IDE (EIDE), nonvolatile memory express (NVMe), or universal flash storage (UFS).

The present disclosure provides a memory device which mitigate or prevent occurrence of an over-current in a bit line write operation and/or mitigate or prevent a decrease of a driving capacity in a source line write operation.

While the inventive concepts have been described with reference to some example embodiments thereof, it will be apparent to those of ordinary skill in the art that various changes and modifications may be made thereto without departing from the spirit and scope of the inventive concepts as set forth in the following claims.

What is claimed is:
1. A memory device comprising:
a variable resistance memory cell including a variable resistance element, a first cell transistor, and a second cell transistor, a first end of the variable resistance element connected to a bit line, a second end of the variable resistance element, a first end of the first cell transistor, and a first end of the second cell transistor connected to a common node, a second end of the first cell transistor and a second end of the second cell transistor connected to a source line; and a word line control circuit configured to separate a sub word line connected to a gate electrode of the second cell transistor from a word line connected to a gate electrode of the first cell transistor in a first write operation and to connect the word line and the sub word line to each other in a second write operation.

2. The memory device of claim 1, wherein the word line control circuit includes:
- a first control transistor configured to be turned off in response to a first power supply voltage so that the word line and the sub word line is separated from each other, and be turned on in response to a second power supply voltage so that the word line is connected to the sub word line, and
- a second control transistor configured to be turned on in response to the first power supply voltage so that the second power supply voltage is supplied to the gate electrode of the second cell transistor, and be turned off in response to the second power supply voltage so that the second power supply voltage is not supplied to the gate electrode of the second cell transistor.

3. The memory device of claim 2, wherein the word line control circuit further includes a level shifter configured to receive and shift the first power supply voltage or the second power supply voltage, and input a shifted voltage to both the gate electrode of the first control transistor and the gate electrode of the second control transistor.

4. The memory device of claim 3, wherein when the shifted voltage is based on the first power supply voltage, a level of the shifted voltage is identical to a level of a word line voltage applied to the word line.

5. The memory device of claim 2, wherein the first control transistor is a PMOS transistor, and the second control transistor is an NMOS transistor.

6. The memory device of claim 1, further comprising:
- a row decoder configured to provide a word line voltage for driving the word line; and
- a write driver and sense amplifier configured to generate a bit line voltage for driving the bit line or a source line voltage for driving the source line.

7. The memory device of claim 6, wherein the memory device is configured such that:
- the bit line voltage is applied to the bit line, and a ground voltage is applied to the source line in the first write operation; and
- the source line voltage is applied to the source line, and the ground voltage is applied to the bit line in the second write operation.

8. The memory device of claim 1, wherein the variable resistance element includes:
- a free layer having a variable magnetization direction;
- a pinned layer having a fixed magnetization direction; and
- a barrier layer between the free layer and the pinned layer.

9. A memory device comprising:
- a variable resistance element having a first end connected to a bit line; and
- a word line control circuit configured to select at least one of a first path or a second path, a second end of the variable resistance element connected to a source line that is commonly on the first path and the second path, wherein
- the first path includes a first cell transistor having a gate electrode connected to a word line,
- the second path includes a second cell transistor having a gate electrode connected to a sub word line,
- the word line control circuit includes a first control transistor and a second control transistor, the first control transistor is configured to be turned off in response to a first power supply voltage so that the word line is separated from the sub word line, and be turned on in response to a second power supply voltage so that the word line is connected to the sub word line, and the second control transistor is configured to be turned on in response to the first power supply voltage so that the second power supply voltage is supplied to the gate electrode of the second cell transistor, and be turned off in response to the second power supply voltage so that the second power supply voltage is not supplied to the gate electrode of the second cell transistor.

10. The memory device of claim 9, wherein the memory device is configured such that,
- the first cell transistor is turned on to enable the first path in a first write operation, and
- the first cell transistor and the second cell transistor are turned on to enable both the first path and the second path in a second write operation.

11. The memory device of claim 10, wherein the memory device is configured such that,
- a bit line voltage is applied to the bit line, and a ground voltage is applied to the source line in the first write operation, and
- a source line voltage is applied to the source line, and the ground voltage is applied to the bit line in the second write operation.

12. The memory device of claim 9, wherein the word line control circuit further includes a level shifter configured to receive and shift the first power supply voltage or the second power supply voltage, and input a shifted voltage to the gate electrode of the first control transistor and the gate electrode of the second control transistor.

13. The memory device of claim 12, wherein when the shifted voltage is based on the first power supply voltage, a level of the shifted voltage is identical to a level of a word line voltage applied to the word line.

14. The memory device of claim 9, wherein the variable resistance element includes:
- a free layer having a variable magnetization direction;
- a pinned layer having a fixed magnetization direction; and
- a barrier layer between the free layer and the pinned layer.

15. A method of writing a memory cell which includes a variable resistance element having a first end connected to a bit line and a second end connected to a source line through at least one of a first path or a second path, the method comprising:
- determining whether a write operation for the memory cell is a bit line write operation or a source line write operation;
- selecting at least one of the first path or the second path based on a result of the determination; and
- performing the bit line write operation or the source line write operation through the selected at least of the first path and the second path,
- wherein the selecting includes,
  - selecting the first path, by a word line control circuit configured to control the first path and the second path, in response to the result of the determination indicating that the write operation is the bit line write operation, and
  - selecting the first path and the second path, by the word line control circuit, in response to the result of the determination indicating that the write operation is the source line write operation.

16. The method of claim 15, wherein when the bit line write operation is performed,
  applying a bit line voltage to the bit line and a ground voltage to the source line in response to the result of the determination indicating that the write operation is the bit line write operation, and
  applying a source line voltage to the source line and the ground voltage to the bit line in response to the result of the determination indicating that the write operation is the source line write operation.

17. The method of claim 15, wherein the variable resistance element includes:
  a free layer having a variable magnetization direction;
  a pinned layer having a fixed magnetization direction; and
  a barrier layer between the free layer and the pinned layer.

\* \* \* \* \*